(12) United States Patent
Xuan

(10) Patent No.: US 7,928,463 B2
(45) Date of Patent: Apr. 19, 2011

(54) LIGHT EMITTING DEVICE

(75) Inventor: Rong Xuan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 63 days.

(21) Appl. No.: 12/436,798

(22) Filed: May 7, 2009

(65) Prior Publication Data

US 2009/0250712 A1    Oct. 8, 2009

Related U.S. Application Data

(63) Continuation-in-part of application No. 12/117,747, filed on May 9, 2008, and a continuation-in-part of application No. 12/146,418, filed on Jun. 25, 2008, now Pat. No. 7,767,996, which is a continuation of application No. 12/117,747, application No. 12/436,798, which is a continuation-in-part of application No. 12/146,422, filed on Jun. 25, 2008, which is a continuation of application No. 12/117,747, application No. 12/436,798, which is a continuation-in-part of application No. 12/351,815, filed on Jan. 10, 2009, now Pat. No. 7,858,991, which is a continuation-in-part of application No. 12/117,747, and a continuation-in-part of application No. 12/146,418, and a continuation-in-part of application No. 12/146,422, and a continuation-in-part of application No. 12/168,073, filed on Jul. 4, 2008, now Pat. No. 7,759,671.

(60) Provisional application No. 61/020,397, filed on Jan. 11, 2008.

(30) Foreign Application Priority Data

Dec. 26, 2008  (CN) .................................. 2008073758

(51) Int. Cl.
    *H01L 33/00*    (2010.01)
(52) U.S. Cl. ............. 257/99; 257/E33.064; 257/E25.032
(58) Field of Classification Search ................ 257/94.79, 257/E33.064, 99, 103, E25.032
    See application file for complete search history.

(56) References Cited

U.S. PATENT DOCUMENTS

| 4,450,460 | A | 5/1984 | Morimoto |
| 5,874,749 | A | 2/1999 | Jonker |
| 6,621,100 | B2 | 9/2003 | Epstein et al. |

(Continued)

FOREIGN PATENT DOCUMENTS

JP          9-219564       8/1997

OTHER PUBLICATIONS

Sandia Lab, Solid-State Lighting Science, Light Creation Materials, ZnO Material Section, http://ssls.sandia.gov/overview/technologies.*

(Continued)

*Primary Examiner* — Thomas L Dickey
*Assistant Examiner* — Nikolay Yushin
(74) *Attorney, Agent, or Firm* — Jianq Chyun IP Office

(57) ABSTRACT

A light emitting device is provided, which includes a light-emitting structure and a magnetic material. The light-emitting structure has an exciting binding energy of a bandgap. The magnetic material is coupled with the light-emitting structure to produce a magnetic field in the light-emitting structure. The exciting binding energy may be higher than about 25.8 meV at room temperature.

23 Claims, 9 Drawing Sheets

U.S. PATENT DOCUMENTS

2006/0256825 A1    11/2006    Matsumura et al.

OTHER PUBLICATIONS

Davis et al., "Large magnetic filed effects in organic light emitting diodes . . . ", 2004, J. Vac. Sci. Technol., vol. A 22, No. 4, p. 1885-1891.*

Carlos et al., "Magnetic resonance studies of GaN based light emitting diodes", 1996, Journal Of Electronic Materials, vol. 25, No. 5, pp. 851-854.*

Sze, "Semiconductor Devices. Physics and Technology", 2002, Jon Willey & Sons, pp. 291-292.

Dunkin et al., "Handbook of Optoelectronics. vol. 1", 2006, Informa, Taylor & Francis Group, pp. 358-359.

Kim et al. "Lateral current transport path, a model for GaN-based light-emitting diodes: Applications to practical device designs", Applied Physics Letters, vol. 81, No. 7, Aug. 12, 2002, p. 1326-1328.

Arnaudov et al. "Electron transport in MOVPE grown InGaN/GaN MQW in moderate magnetic field", 10th European Workshop on MOVPE, Lecce (Italy) Jun. 8-11, 2003.

"1st Office Action of China Counterpart Application", issued on Oct. 13, 2010, p. 1-p. 3, in which the listed reference was cited.

* cited by examiner

LIGHT EMITTING DEVICE

CROSS-REFERENCE TO RELATED APPLICATION

This application claims the priority benefit of PCT application Ser. No. PCT/CN2008/073758, filed on Dec. 26, 2008. This application is also a continuation-in-part application of and claims priority benefits of U.S. non-provisional application Ser. No. 12/117,747, filed on May 9, 2008, U.S. non-provisional application Ser. No. 12/146,418, filed on Jun. 25, 2008, U.S. non-provisional application Ser. No. 12/146,422, filed on Jun. 25, 2008, and U.S. non-provisional application Ser. No. 12/351,815, filed on Jan. 10, 2009, now pending. The prior application Ser. No. 12/117,747 claims the priority benefit of U.S. provisional application Ser. No. 61/020,397, filed on Jan. 11, 2008. The prior application Ser. No. 12/146,418 and Ser. No. 12/146,422 are continuation applications of and claim the priority benefit of the said non-provisional application Ser. No. 12/117,747. The prior application Ser. No. 12/351,815 is a continuation-in-part application of and claims priority benefits of the said non-provisional application Ser. No. 12/117,747, the said non-provisional application Ser. No. 12/146,418, the said non-provisional application Ser. No. 12/146,422, and U.S. non-provisional application Ser. No. 12/168,073, filed on Jul. 4, 2008 and also claims the priority benefit of the said provisional application Ser. No. 61/020,397. The prior PCT application Ser. No. PCT/CN2008/073758 claims the priority benefits of the said non-provisional application Ser. No. 12/117,747, the said non-provisional application Ser. No. 12/146,418, the said non-provisional application Ser. No. 12/146,422, and the said non-provisional application Ser. No. 12/168,073 and also claims the priority benefit of the said provisional application Ser. No. 61/020,397. The entirety of each of the above-mentioned patent applications is hereby incorporated by reference herein and made a part of this specification.

BACKGROUND

1. Technical Field

The disclosure generally relates to a light emitting device, and in particular, to a light emitting device with a magnetic field.

2. Description of Related Art

Light emitting device, such as a light emitting diode (LED) can emit light due to the driving of electron current through the active layer of the light emitting diode. However, if current density is not uniformly distributed to the whole light emitting area, the light uniformity is reduced. Even further, the non-transparent top electrode, in conventional design, is usually positioned at the center region of the light emitting area. In this manner, the current density under the top electrode is larger than the other region and can emit more light. However, the emitted light under the top electrode is blocked since the top electrode is not transparent to the light. The top electrode of the conventional LED blocks the emitted light at the central region with the highest intensity, resulting in reduction of the output light.

How to improve the light output efficiency of the LED still need further development in the field of the art.

SUMMARY

Accordingly, the disclosure is directed to a light emitting device with magnetic field, so as to at least improve light emitting efficiency.

The light emitting device of the disclosure is provided, which includes a light-emitting structure and a magnetic material. The light-emitting structure has an exciting binding energy of a bandgap. The magnetic material is coupled with the light-emitting structure to produce a magnetic field in the light-emitting structure. The exciting binding energy may be higher than about 25.8 meV at room temperature.

The light emitting device of the disclosure is provided, which includes a light-emitting structure and a magnetic material. The light-emitting structure includes a P-type layer, a light emitting layer, an N-type layer, and a transparent conductive layer. The N-type layer has an electrical resistivity $\rho_n$, a thickness $t_n$ and a carrier mobility $\mu_n$, and the transparent conductive layer has an electrical resistivity $\rho_t$, a thickness $t_t$ and a carrier mobility $\mu_t$. During the light emitting device operates, a current flows through the N-type layer within a depth $t_{nI}$ in a cross-section of the N-type layer, and the depth $t_{nI}$ is smaller than or equal to the thickness $t_n$. The magnetic material is coupled with the light-emitting structure to produce a magnetic field B in the light-emitting structure. While the magnetic field B provided by the magnetic material is applied to the light emitting device, a magnetoresistance of the transparent conductive layer $$\frac{\rho_t}{t_t}(1+\mu_t^2 B^2)$$

is substantially equal to a magnetoresistance of the N-type layer $$\frac{\rho_n}{t_{nI}}(1+\mu_n^2 B^2).$$

In other words, with the application of the magnetic field, the magnetoresistance in the light emitting device obeys a formula represented by $$\frac{\rho_t}{t_t}(1+\mu_t^2 B^2) \cong \frac{\rho_n}{t_{nI}}(1+\mu_n^2 B^2).$$

As mentioned above, the magnetic material is integrated into the structure of the light emitting device. In other words, the magnetic field is separately self-supplied in a single light emitting device. The single light emitting device can also be easily packaged into a chip. Therefore, the magnetic field can be applied to the light emitting device in the manners as described above, so as to enhance the light emitting efficiency and increase the luminance of the light emitting device.

In order to make the aforementioned and other features and advantages of the disclosure more comprehensible, preferred embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
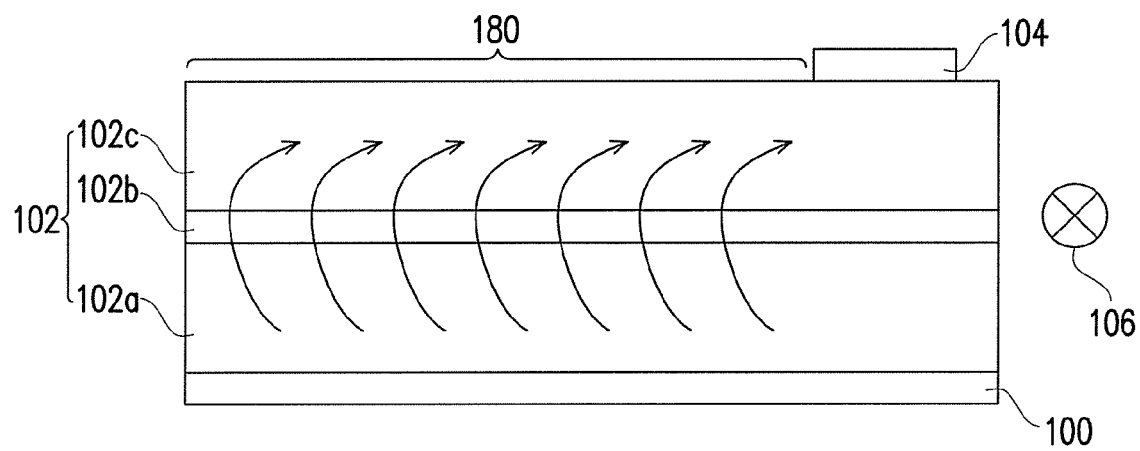
FIG. 1 depicts, in a cross-sectional view, a light emitting device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In physical phenomenon, the Hall effect is well known that when a current flow through a conductive line and an external magnetic field is applied transversely, then the path of the current, such as the electron current, is also transversely shifted due to magnetic Lorenz force of $F=q*v*B$. The disclosure involves the consideration of the Hall effect and implements the Hall effect into light emitting devices.

FIG. 1 depicts, in a cross-sectional view, a structure of a light emitting device with the magnetic field according to an embodiment of the disclosure. In FIG. 1, a light emitting diode (LED) is taken as the example. The light emitting diode includes, for example, a bottom electrode 100, a light-emitting structure 102, a top electrode 104. The light-emitting stacked layer 102 includes, for example, a first doped layer 102a, such as P-doped layer, an active layer 102b for emitting light based on combination of electrons and holes, and a second doped layer 102c, such as N-doped layer. The top electrode 104 can be, for example, not position at the center of the light emitting area 108.

When in operation the current flows from the bottom electrode 100 to the top electrode 104. However, if an external magnetic field in a direction, such as an indication to go in the paper as designated by notion 106, is transversely applied, the Lorenz force is produced to shift and spread the current, as shown in FIG. 1. Alterations or modifications of the conductive types of the electrodes and the direction of the magnetic field are allowed according to the actual design, while the concept remains the same. As a result, the current are transversely shifted and can still flow from the bottom electrode to the top electrode, which is at the side region of the light emitting area 108. The driving current can more effectively cause the active layer 102b to emit light.

For the structure illustrated in FIG. 1, the two electrodes 100 and 104 are at opposite sides of the light-emitting stacked layer 102, and then the magnetic is applied parallel to the light emitting area 180, in which the driving current is shifted inside light-emitting stacked layer 102. However, when the electrode is arranged at the same side of the light-emitting stacked layer, a large horizontal-component current is produced, and the direction of magnetic field can be accordingly changed.

Additionally, when considering the quantum effect, the magnetic field applied to the light emitting device, such as LED, can also improve the conversion efficiency for producing light in the light emitting device. The basic mechanism is that exertion of the magnetic field can increase exciting binding energy of a bandgap in material of the active region, resulting in enhancing the probability of carrier combination. In more detail, the exciting binding energy between the conductive band and the valence band can be closer to the valence band with the aid of the magnetic field, and thereby the internal quantum efficiency (IQE) in the material of the light emitting device can be enhanced effectively. In general, the improvement is more significant for the material having the exciting binding energy higher than thermal voltage at room temperature, e.g. about 25.8 meV. The light-emitting structure of the light emitting device, for example, includes a semiconductor material with the desirable exciting binding energy. In an embodiment, the light-emitting structure of the light emitting device may include an inorganic material with the exciting binding energy higher than 25.8 meV. The inorganic material can be a nitride-based material, such as GaN. Other inorganic materials with the exciting binding energy higher than 25.8 meV, e.g. Si, CdS, BaO, KI, KCl, KBr, RbCl, LiF and AgCl, can also be employed to the light-emitting structure. In an embodiment, the light-emitting structure of the light emitting device may include an organic material with the exciting binding energy higher than 25.8 meV, such as phosphorescence material, fluorescent material, etc. The phosphorescence material can be red, green, blue or dendrimer, and the fluorescent material can be red, green, blue, yellow or white, for example.

The exciting binding energy in the semiconductor material would increase as the magnitude of the applied magnetic field rises. In other words, the disclosure proposes that the magnetic field applied to the light emitting device can extra increase the exciting binding energy, the IQE and the carrier combination, such that the light emitting efficiency is remarkably improved.

With the external magnetic field applied to the light emitting device, not only the homogeneity of the carrier density in the semiconductor is altered, but also the light emitting efficiency is enhanced. Accordingly, the light emitting device has higher luminance efficiency for optoelectronic transformation even though the amount of injected current remains unchanged.

It should be noted herein that the intensity of the external magnetic field applied to the light emitting device may be larger than 0.01 gauss (G), for example. Moreover, the magnetic field can be provided by a magnet, a magnetic thin film, an electromagnet, or any other kind of magnetic material, and the number thereof is not limited herein. In addition, the magnetic material may be coupled to the light emitting device itself in the form of a magnetic film or a magnetic bulk, depending upon the thickness thereof. It should also be noted that the direction of the magnetic field may be properly arranged, such as vertical arrangement, horizontal arrangement or any direction relative to the light emitting device. The magnetic material may be a ferromagnetic material, such as Rb, Ru, Nd, Fe, Pg, Co, Ni, Mn, Cr, Cu, $Cr_2$, Pt, Sm, Sb, Pt, or an alloy of the foregoing materials in combination. The magnetic material may also be a ceramic material, such as oxides of Mn, Fe, Co, Cu and V, $Cr_2O_3$, CrS, MnS, MnSe, MnTe, fluorides of Mn, Fe, Co and Ni, chlorides of V, Cr, Fe, Co, Ni and Cu, bromides of Cu, CrSb, MnAs, MnBi, α-Mn, $MnCl_2.4H_2O$, $MnBr_2.4H_2O$, $CuCl_2.2H_2O$, $Co(NH_4)x(SO_4)xCl_2.6H_2O$, $FeCo_3$, and $FeCo_3.2MgCO_3$. The light emitting device can be an inorganic LED or an organic LED (OLED), either in a vertical type, a horizontal type, a thin film type or a flip chip type.

Based on the forgoing regards, in a practical application, the light emitting device can be combined with magnetic material through various manners such as epoxy, metal bonding, wafer bonding, epitaxial embedding and coating. Embodiments of the light emitting device with the magnetic material adopting foregoing structures are described as follows, respectively. It is noted that the following embodiments in which the first conductivity type is P-type and the second conductivity type is N-type is provided for illustration purposes, and should not be construed as limiting the scope of the disclosure.

Figure 2:
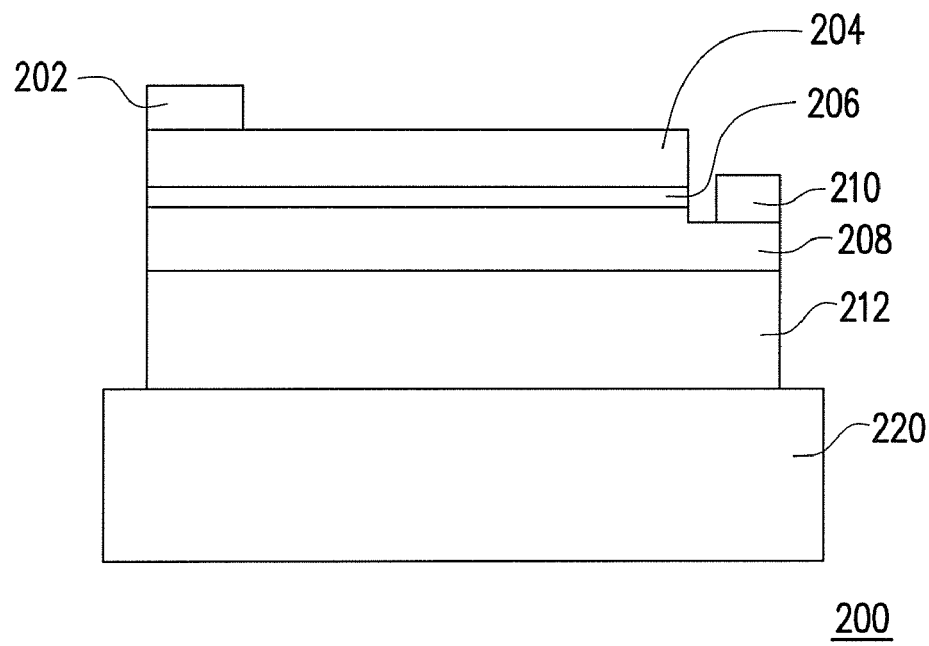
FIGS. 2-5 are schematic cross-sectional diagrams schematically illustrating a light emitting device according to an embodiment of the disclosure, respectively.

As for a standard LED having a horizontal type structure, FIG. 2 is a schematic cross-sectional diagram illustrating a light emitting device according to an embodiment of the disclosure. Referring to FIG. 2, the light emitting device 200 is a horizontal type LED, which includes a light-emitting structure coupled with a magnetic material. In an embodiment, the light-emitting structure is disposed on a magnetic submount 220 through an epoxy, a metal bonding, a wafer bonding, epitaxial embedding, or a coating process. The magnetic submount 220 is, for example, a ferromagnetic layer with a magnetization in a desired direction.

The light-emitting structure includes a first electrode 202, a first doped layer 204, an active layer 206, a second doped layer 208, a second electrode 210, and a substrate 212. The substrate 212 is mounted on the magnetic submount 220. The first doped layer 204, such as a P-type doped layer, the active layer 206, and the second doped layer 208, such as an N-type doped layer, jointly form a light-emitting stacked layer disposed on the substrate 212. The first electrode 202 is disposed on the first doped layer 204 and electrically coupled to the first doped layer 204. The second electrode 210 is disposed at the same side of the first electrode 202 and electrically coupled to the second doped layer 208. Accordingly, a horizontal type LED structure is formed. The active layer 206 is disposed between the first doped layer 204 and the second doped layer 208, and capable of generating light when a current flows through it.

The magnetic field generated by the magnetic submount 220 is exerted on the light-emitting structure, such that the exciting binding energy of the semiconductor material in the light-emitting structure is increased to enhance an overall emitting efficiency of the light emitting device 200.

Figure 3:
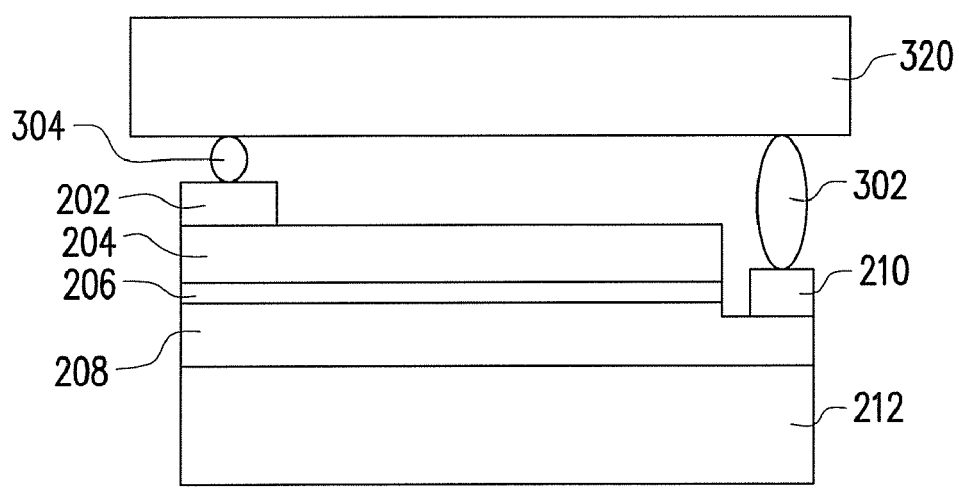

FIG. 3 is a schematic cross-sectional diagram illustrating a light emitting device according to an embodiment of the disclosure. The identical elements shown in FIGS. 2 and 3 are designated with the same reference numbers, and detailed descriptions of the same or like elements are omitted hereinafter.

As shown in FIG. 3, the structural components of the light emitting device 300 are roughly similar to that of the light emitting device 200 shown in FIG. 2, while the difference lies in the deployment of the magnetic material. In an embodiment, in order to implement the magnetic source, a packaging structure, such as a flip chip package, can be employed to couple the magnetic material with the light-emitting structure. The first electrode 202 and the second electrode 210 of the light-emitting structure can be mounted onto a magnetic submount 320. In an embodiment, the light-emitting structure may be packaged onto the magnetic submount 320 through the bonding structures 302 and 304. The bonding structures 302 and 304 are, for example, bounding bumps. In another embodiment, the light-emitting structure may be directly bonding onto the magnetic submount 320 without any bonding structures. That is to say, the first electrode 202 and the second electrode 210 can be directly mounted on the surface of the magnetic submount 320. As a result, the magnetic submount 320 can produce the magnet field into the light emitting device 300, and the exciting binding energy of the semiconductor material in the light-emitting structure is thus increased to enhance the emitting efficiency of the light emitting device 300.

Figure 4:
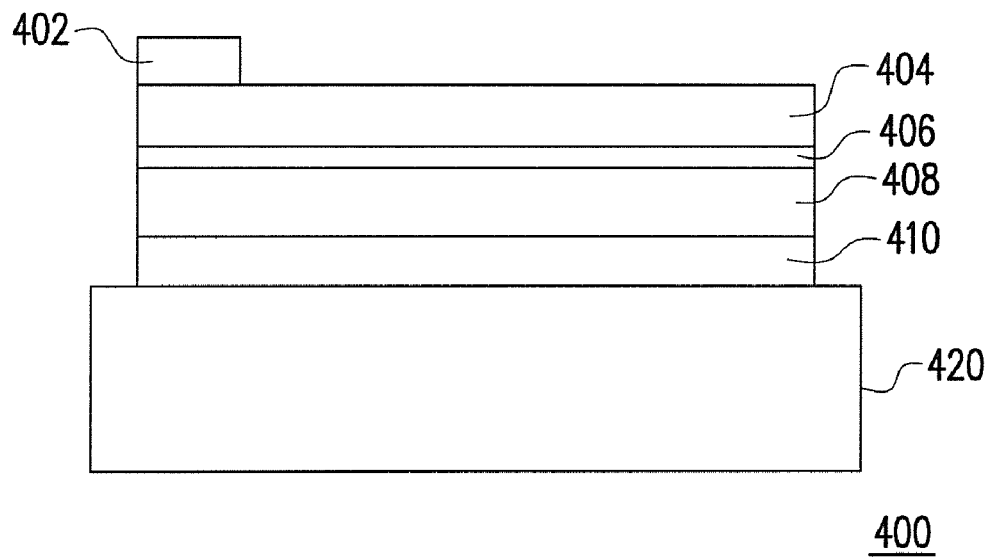

FIG. 4 is a schematic cross-sectional diagram illustrating a light emitting device according to an embodiment of the disclosure.

As for a thin film LED having a vertical type structure, FIG. 4 is a schematic cross-sectional diagram illustrating a light emitting device according to one embodiment of the disclosure. Referring to FIG. 4, the light emitting device 400 in this embodiment is a vertical type LED, which includes a light-emitting structure and a magnetic submount 420. The light-emitting structure is disposed on the magnetic submount 420 through an epoxy, a metal bonding, a wafer bonding, epitaxial embedding, or a coating process.

The light-emitting structure includes, from top to bottom, a second electrode 402, a second doped layer 404, an active layer 406, a first doped layer 408 and a first electrode 410. The magnetic submount 420 serves as a substrate for the light-emitting structure. The second doped layer 404, the active layer 406, and the first doped layer 408 form a light-emitting stacked layer, which is deployed on the magnetic submount 420. The second electrode 402 is disposed on the second doped layer 404 and electrically coupled to the second doped layer 404. The first electrode 410 is disposed between the first doped layer 408 and the magnetic submount 420, and electrically coupled to the first doped layer 408. Accordingly, a vertical type LED structure is formed. The active layer 406 is disposed between the second doped layer 404 and the first doped layer 408, and capable of generating light when a current flows through it.

Likewise, the magnetic field induced by the magnetic submount 420 is exerted on light-emitting structure, such that the exciting binding energy of the semiconductor material in the light-emitting structure is increased to enhance an overall emitting efficiency of the light emitting device 400.

Figure 5:
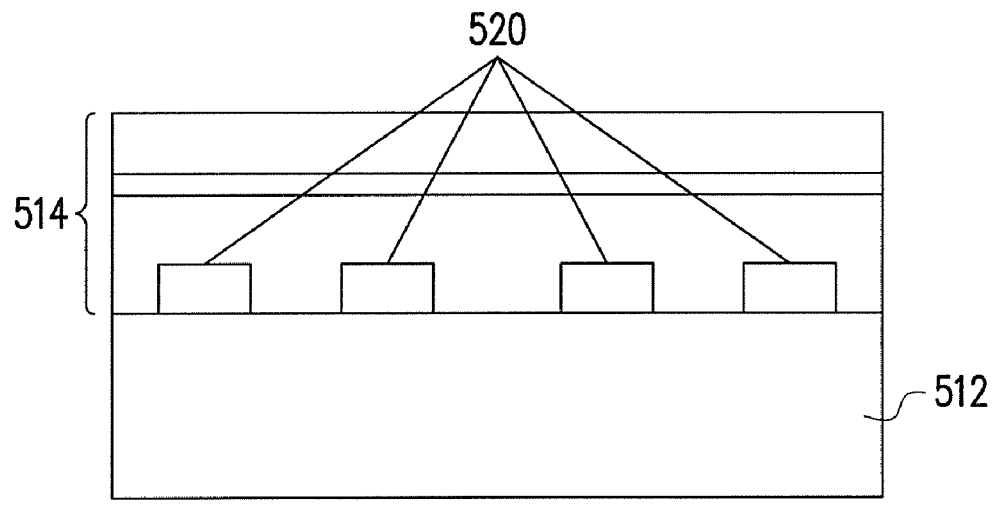

FIG. 5 is a cross-sectional diagram schematically illustrating a light emitting device according to an embodiment of the disclosure. The light emitting device 500 includes a light-emitting structure coupled with an embedded magnetic material. Referring to FIG. 5, the magnetic layer 520 can be formed between a substrate 512 and the light-emitting structure 514 based on the technology of epitaxial laterally overgrown (ELOG). In an embodiment, the magnetic layer 520 may be formed on the substrate 512 and then patterned into the intended pattern, such as strip or block. Thereafter, a lower semiconductor layer of the light-emitting structure 514 can be grown by ELOG process. The magnetic layer 520 embedded in the semiconductor material provide the magnetic field to the light emitting device 500 for enhancing the exciting binding energy thereof. Accordingly, the luminous efficiency of the light emitting device 500 is efficaciously advanced by the application of the magnetic field.

Figure 6A:
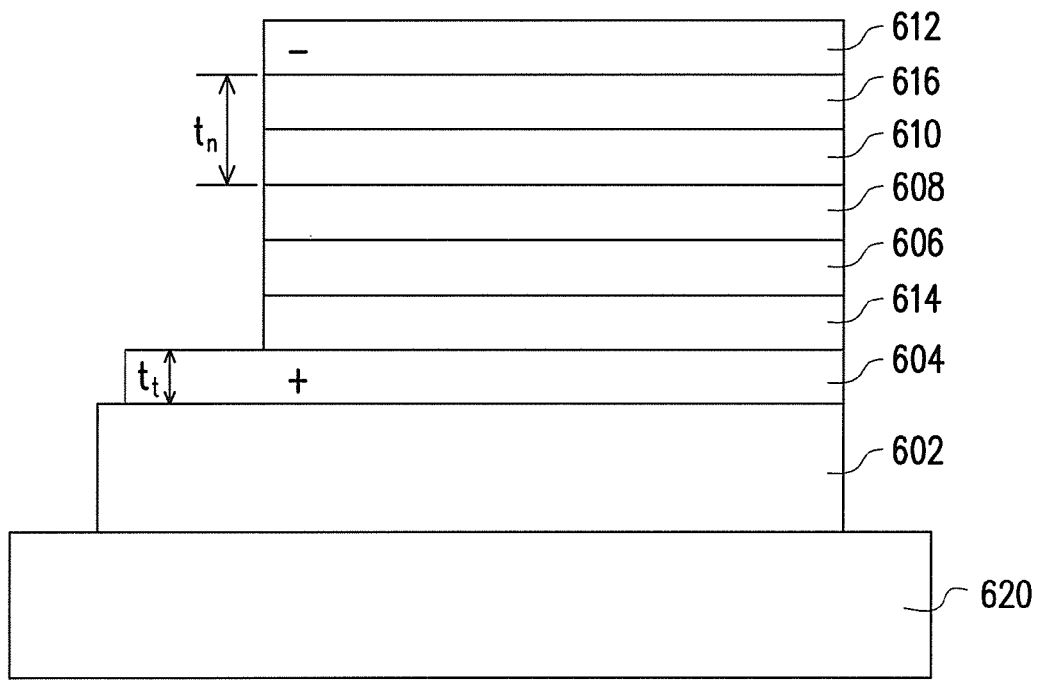
FIGS. 6A-6B are cross-sectional diagrams schematically illustrating a light emitting device according to an embodiment of the disclosure, respectively.
Figure 6B:
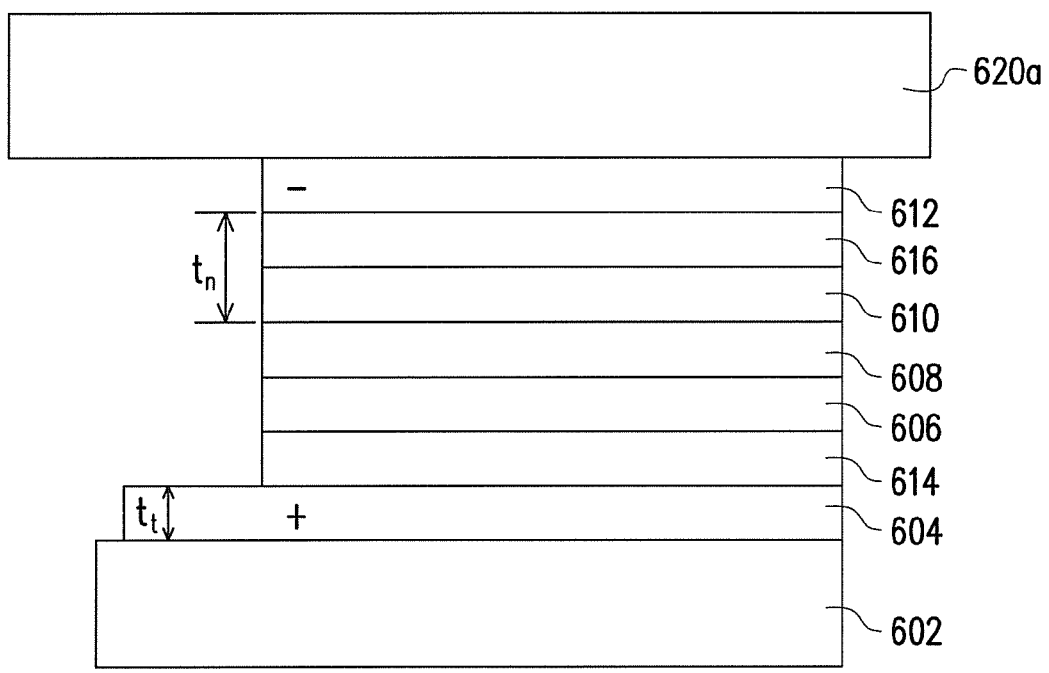

FIGS. 6A-6B are cross-sectional diagrams schematically illustrating a light emitting device according to an embodiment of the disclosure, respectively. The identical elements shown in FIGS. 6A and 6B are designated with the same reference numbers, and detailed descriptions of the same or like elements are omitted hereinafter.

Referring to FIG. 6A, the light emitting device 600, which includes a light-emitting structure coupled with a magnetic layer 620. In an embodiment, the light-emitting structure is disposed on a magnetic layer 620 through an epoxy, a metal bonding, a wafer bonding, epitaxial embedding, or a coating process.

The light-emitting structure is, for example, a stacked structure of an organic electroluminescent device (OLED), which includes a substrate 602, an anode layer 604, a hole transporting layer (HTL) 606, an electroluminescent layer 608, an electron transporting layer (ETL) 610 and a cathode layer 612. The substrate 602 is disposed on the magnetic layer 620, and the anode layer 604 is disposed on the surface of the substrate 602. The hole transporting layer (HTL) 606, the electroluminescent layer 608 and the electron transporting layer (ETL) 610 are, for example, stacked between the anode layer 604 and the cathode layer 612, wherein the electroluminescent layer 608 is disposed between the hole transporting layer (HTL) 606 and the electron transporting layer (ETL) 610. The substrate 602 can be a transparent substrate, e.g. a glass substrate. The anode layer 604 is typically composed of metal or transparent conductive material, such as indium tin oxide (ITO), silicon, tin oxide, gold, silver, platinum or copper. In an embodiment, the anode layer 604 may be a transparent conductive layer including indium tin oxide (ITO) or silicon. The hole transporting layer (HTL) 606, the electroluminescent layer 608 and the electron transporting layer (ETL) 610 can be composed of organic material, respectively. The cathode layer 612 may include metal or a transparent conductive material, such as aluminum, silver or indium tin oxide (ITO). However, it should be noted that the disclosure is not limited to the above materials. Other suitable materials may also be used to achieve the purpose of the disclosure, and is construed to be within the scope of the disclosure.

In an embodiment, the light emitting device 600 may further include a hole injection layer (HIL) 614 and an electron injection layer (EIL) 616 in the stacked structure. The hole injection layer (HIL) 614 is deployed between the hole transporting layer (HTL) 606 and the anode layer 604. The electron injection layer (EIL) 616 is deployed between the cathode layer 612 and the electron transporting layer (ETL) 610. It is noted that the organic light-emitting structure can also be implemented by containing at least one of the foregoing layers between the anode layer 604 and the cathode layer 612, and is not construed as limiting the scope of the disclosure.

As an offset voltage is applied between the anode layer 604 and the cathode layer 612, electrons are injected into the electron transporting layer (ETL) 610 from the cathode layer 612 and are transmitted to the electroluminescent layer 608, while holes are injected into the hole transporting layer (HTL) 606 from the anode layer 604. Further, the injected holes are transmitted to the electroluminescent layer 608, where the electrons and the holes are recombined to generate excitons and produce luminous effect. The magnetic field generated by the magnetic layer 620 is exerted on the light-emitting structure, such that the exciting binding energy of the material in the light-emitting structure is increased to enhance an overall emitting efficiency of the light emitting device 600.

The organic light emitting device can have another configuration. As shown in FIG. 6B, the structural components of the light emitting device 600a are roughly similar to that of the light emitting device 600 shown in FIG. 6A, while the difference lies in the deployment of the magnetic layer 620a. In an embodiment, a packaging structure, e.g. a flip chip package, can be employed to couple the magnetic layer 620a with the light-emitting structure. In other words, the stacked light-emitting structure may be packaged with the magnetic layer 620a by mounting the cathode layer 612 to the magnetic layer 620a, so as to form the flip chip structure. Similarly, the magnetic field generated by the magnetic layer 620a can increase the exciting binding energy of the material in the light-emitting structure, thereby enhancing an overall emitting efficiency of the light emitting device 600a.

Following examples are provided to prove that the light emitting device having a material with the exciting binding energy higher than 25.8 meV has better improvement in the IQE and luminous efficiency with the exertion of the magnetic field. These examples are provided merely to illustrate effects upon a photoluminescence (PL) made by the deployment of the magnetic material in the disclosure, but are not intended to limit the scope of the disclosure.

Example I

Figure 7A:
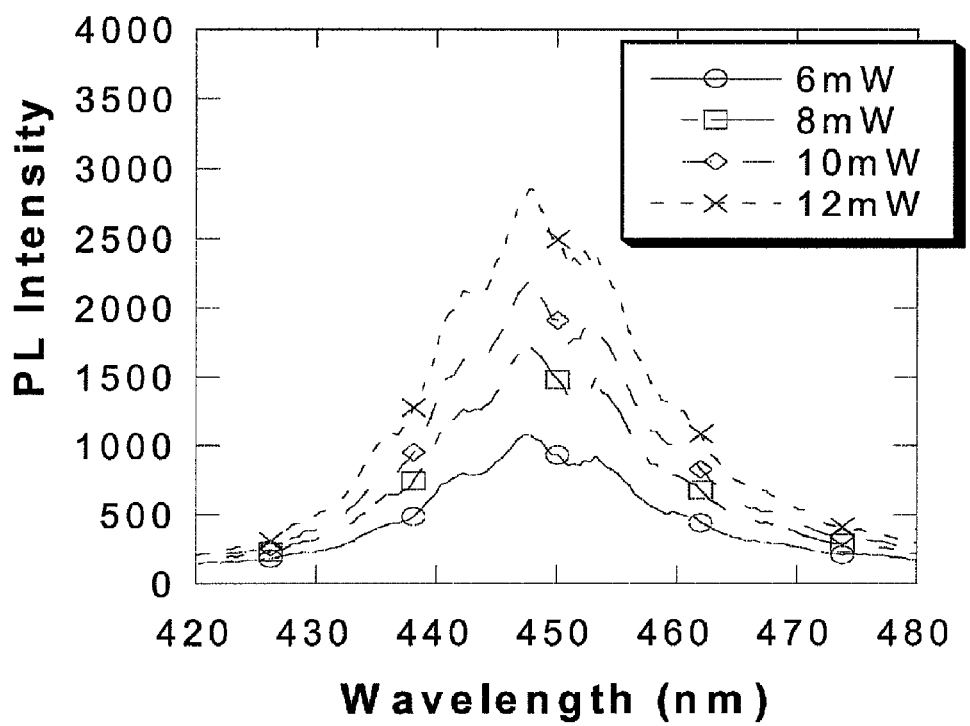
FIG. 7A schematically illustrates distribution curves of wavelength versus PL intensity under various pumping power of laser according to a light emitting device without applying the magnetic field.
Figure 7B:
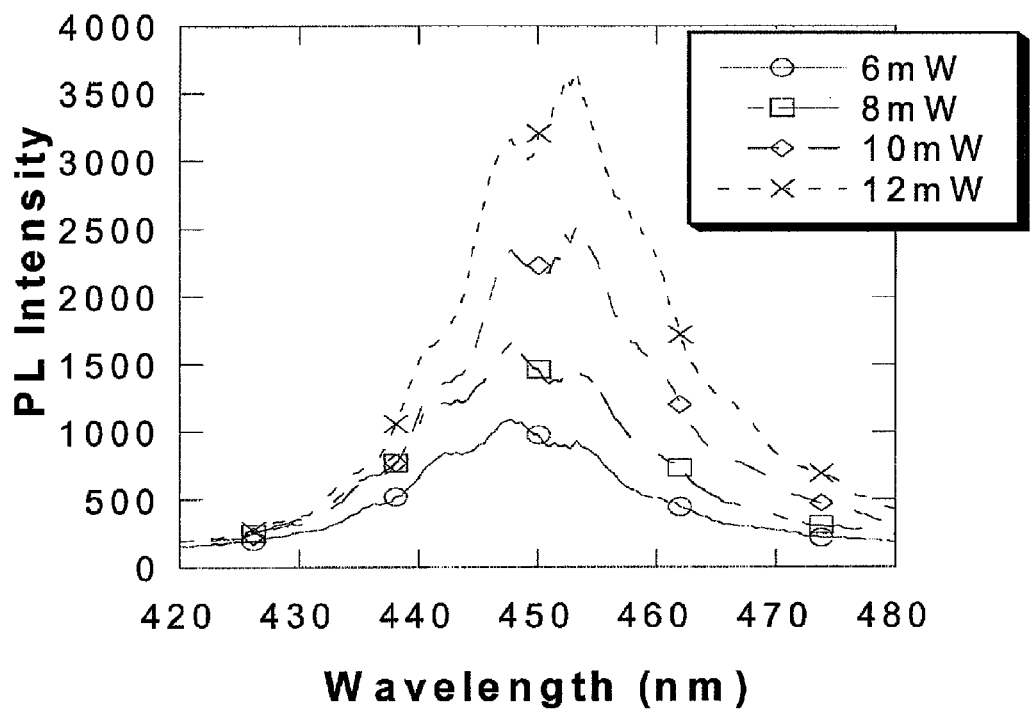
FIG. 7B schematically illustrates distribution curves of wavelength versus PL intensity under various pumping power of laser according to a light emitting device with applying the magnetic field.

FIG. 7A schematically illustrates distribution curves of wavelength versus PL intensity under various pumping power of laser according to a light emitting device without applying the magnetic field. FIG. 7B schematically illustrates distribution curves of wavelength versus PL intensity under various pumping power of laser according to a light emitting device with applying the magnetic field.

A GaN chip is utilized as a sample, of which the exciting binding energy is higher than 25.8 meV. Different intensity of the laser is then pumped into the GaN chip under the identical conditions except the applied magnetic field, so that photoluminescence generated by the material of the chip is then collected and measured. The laser with pumping power of 6 mW, 8 mW, 10 mW and 12 mW is pumped into the GaN chip without applying the magnetic field or with applying the magnetic field, and the test results are shown in FIG. 7A and FIG. 7B, respectively.

As can be seen from the curves, the measured PL intensity in the light emitting device with the applied magnetic field (as shown in FIG. 7B) is higher than that in the light emitting device without the applied magnetic field (as shown in FIG. 7A). Accordingly, it turns out that the magnetic field can significantly improve the PL intensity and thereby enhance the luminous efficiency. In particular, under the same pumping power pumped into the devices, as shown by the curves representing 12 mW in respective FIG. 7A and FIG. 7B, it is clear that the light emitting device with the aid of the magnetic field has relative high PL intensity which can be even up to about 27% of improvement. In summary, the light emitting efficiency of the light emitting device including a material with the exciting binding energy higher than 25.8 meV can be significantly enhanced by applying the magnetic field. Thus, the device performance can be effectively promoted.

In spite of the IQE discussed above, in the field of a transparent conductive layer (TCL) further disposed in the light emitting device to enhance the current uniformity thereof, several aspects of the transparent conductive layer should be take into consideration. The transparent conductive layer may be disposed on the surface of the P-type layer. In addition to high transmittance of the transparent conductive layer, impedance matching between the transparent conductive layer and the N-type layer is also important so as to achieve a better effect on current crowding.

In the case of the light emitting device including the transparent conductive layer, the achievement of impedance matching between the transparent conductive layer and the N-type layer may depend upon various parameters, such as an electrical resistivity $\rho_t$, a thickness $t_t$ and a carrier mobility $\mu_t$ of the transparent conductive layer, and an electrical resistivity $\rho_n$ and a carrier mobility $\mu_n$ of the N-type layer. It is noted that during the light emitting device operates, the current flows through the N-type layer only within a portion of the region close to an interface between the N-type layer and the active layer (i.e. light-emitting layer). Therefore, a depth of the current path in a cross-section of the N-type layer represented by $t_{nI}$ also can also affect the achievement of the impedance matching, wherein the depth of the current path $t_{nI}$ is smaller than or equal to a whole thickness $t_n$ of the N-type layer.

When the light emitting device operates without the magnetic field, an original resistance of the transparent conductive layer is represented by $$\frac{\rho_t}{t_t}$$

and an original resistance of the N-type layer is represented by $$\frac{\rho_n}{t_{nl}}.$$

In general, the original resistance of the transparent conductive layer $$\frac{\rho_t}{t_t}$$

is not equal to the original resistance of the N-type layer $$\frac{\rho_n}{t_{nl}}.$$

In order to achieve the largest uniform distribution area of the current is obtained in the light emitting device, the impedance matching between the transparent conductive layer and the N-type layer is required, which indicates $$\frac{\rho_t}{t_t} \cong \frac{\rho_n}{t_{nl}}.$$

Figure 8:
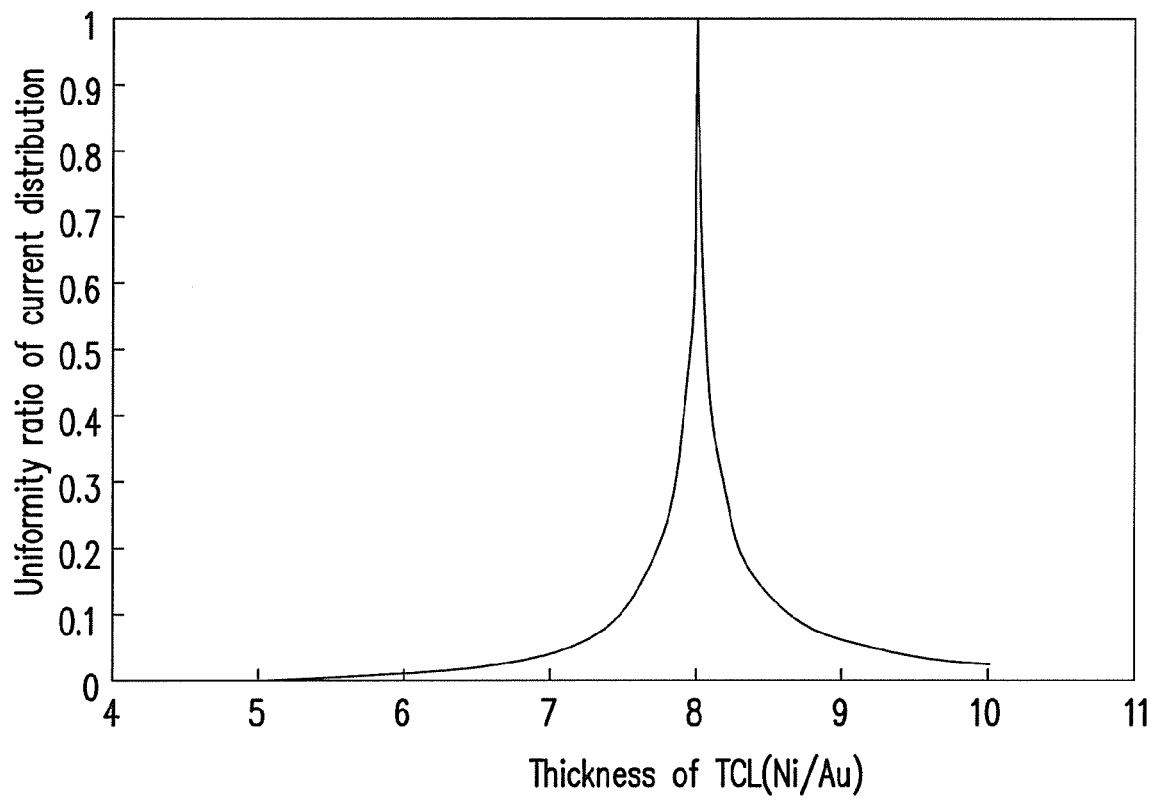
FIG. 8 schematically illustrates a distribution curve of thickness of TCL versus uniformity ratio of current distribution according to a conventional light emitting device without the application of the magnetic field.

FIG. 8 schematically illustrates a distribution curve of thickness of TCL versus uniformity ratio of current distribution according to a conventional light emitting device without the application of the magnetic field. As shown in FIG. 8, an alloy of nickel and gold, i.e. Ni/Au, serves as the transparent conductive material in the light emitting device. When the thickness $t_t$ of Ni/Au layer is about 80 Å, the uniformity ratio of current distribution is equal to 1 which indicates the largest uniform distribution area of the current. The uniformity ratio of current distribution, however, drops drastically due to a minor variation in the thickness $t_t$ of Ni/Au. That is to say, tolerance of the thickness in the process is too small to be exercised in practical applications. Accordingly, the above-mentioned impedance matching of the conventional light emitting device cannot possibly achieved by merely adjusting the thickness of the transparent conductive layer or the thickness of the N-type layer.

The magnetoresistance effect, however, can be applied facilitating the whole equivalent resistance in the light emitting device to be matched. The magnetoresistance Rb is increased with the applied magnetic field B and obeys a equation represented by $R_b(B) = R_0(1+\mu^2 B^2)$, in which $R_0$ represents an original resistance of the material without applying magnetic field and $\mu$ represents carrier mobility of the material. While the magnetic field B provided by the magnetic material is applied to the light emitting device of the disclosure, a magnetoresistance of the transparent conductive layer is represented by $$\frac{\rho_t}{t_t}(1+\mu_t^2 B^2)$$

and a magnetoresistance of the N-type layer is represented by $$\frac{\rho_n}{t_{nl}}(1+\mu_n^2 B^2).$$

When the magnetoresistance of the transparent conductive layer $$\frac{\rho_t}{t_t}(1+\mu_t^2 B^2)$$

is substantially equal to the magnetoresistance of the N-type layer $$\frac{\rho_n}{t_{nl}}(1+\mu_n^2 B^2),$$

the impedance matching can be achieved with the application of the magnetic field, that is, $$\frac{\rho_t}{t_t}(1+\mu_t^2 B^2) \cong \frac{\rho_n}{t_{nl}}(1+\mu_n^2 B^2).$$

In an embodiment, an approximate equality range of the magnetoresistance of the transparent conductive layer and the magnetoresistance of the N-type layer can be defined by equation $$\left| \frac{\frac{\rho_t}{t_t}(1+\mu_t^2 B^2) - \frac{\rho_n}{t_{nl}}(1+\mu_n^2 B^2)}{\frac{\rho_t}{t_t}(1+\mu_t^2 B^2) + \frac{\rho_n}{t_{nl}}(1+\mu_n^2 B^2)} \right| \leq 0.2.$$

In more detail, the carrier mobility of the N-type layer is usually greater than the carrier mobility $\mu_t$ of the transparent conductive layer due to the intrinsic material property. When the original resistance is a constant at both side of the impedance matching equation, increase in the magnetoresistance of the N-type layer is higher than increase in the magnetoresistance of the transparent conductive layer after a constant magnetic field is applied to the light emitting device. Accordingly, in an embodiment, when the magnetic field is not applied to the light emitting device, the original resistance of the transparent conductive layer is set for a value higher than the original resistance of the N-type layer, that is, $$\frac{\rho_t}{t_t} \geq \frac{\rho_n}{t_{nl}}.$$

In an embodiment, the relationship between the original resistance of the transparent conductive layer and the N-type layer can be represented by equation $$\frac{\left|\frac{\rho_t}{t_t} - \frac{\rho_n}{t_{nl}}\right|}{\left|\frac{\rho_t}{t_t} + \frac{\rho_n}{t_{nl}}\right|} \leq 0.5.$$

In the aforementioned regards, with applying the magnetic field to the light emitting device in the disclosure, the best condition for the impedance matching between the transparent conductive layer and the N-type layer can be achieved by finely adjusting the respective thicknesses of the transparent conductive layer and the N-type layer. As compared with the conventional light emitting device having extremely low tolerance of the thickness, the magnetoresistance of the transparent conductive layer can be easily controlled to be substantially equal to the magnetoresistance of the N-type layer owing to the application of the magnetic field, such that the light emitting efficiency can be significantly enhanced.

In an embodiment, material of the transparent conductive layer can be metal or semiconductor. When the transparent conductive layer is composed of metal, such as Ni/Au, the thickness $t_t$ may be within a range of 50 Å to 150 Å. When the transparent conductive layer is composed of semiconductor, such as indium tin oxide (ITO) and zinc oxide (ZnO), the thickness $t_t$ may be within a range of 1000 Å to 5000 Å. In an embodiment, material of the N-type layer can be semiconductor, e.g. GaAs, nitride-based material, In-based material, Al-based material, Ga-based material, Si-based material, or Pb-based material. The magnetic field B is, for example, greater than 0.01 gauss (G).

Several practical applications of the foregoing light emitting device structures according to this disclosure are provided below. It is to be understood that the following structures are intended to explain the fabrication of the relationship in thickness between the transparent conductive layer and the N-type layer, thereby enabling those of ordinary skill in the art to practice this disclosure, but are not intended to limit the scope of this disclosure. It is to be appreciated by those of ordinary skill in the art that other elements can be arranged and formed in a manner not shown in the illustrated embodiments according to known knowledge in the art.

Figure 9:
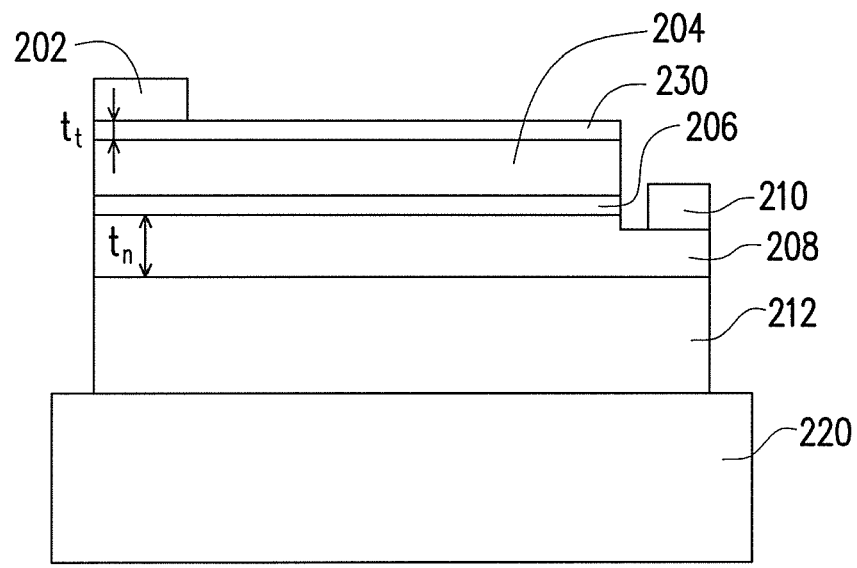
FIGS. 9-11 are schematic cross-sectional diagrams schematically illustrating a light emitting device according to an embodiment of the disclosure, respectively.

FIG. 9 is a schematic cross-sectional diagram illustrating a light emitting device according to an embodiment of the disclosure. Referring to FIG. 9, the light emitting device 200a is a horizontal type LED, which includes a light-emitting structure coupled with a magnetic material. The structure of the light emitting device 200a is roughly similar to that of the light emitting device 200 shown in FIG. 2, while the difference lies in the deployment of a transparent conductive layer 230. The transparent conductive layer 230 is further disposed above the first doped layer 204, so as to enhance the effect of current crowding. The transparent conductive layer 230 has a thickness $t_t$, and the second doped layer 208, i.e. N-type layer, has a thickness $t_n$. The thickness $t_t$ and the thickness $t_n$ can be adjusted in accordance with different materials of the transparent conductive layer 230 and the second doped layer 208 respectively, so that the magnetoresistance of the transparent conductive layer 230 is easily controlled to be substantially equal to that of the second doped layer 208 with the application of the magnetic field. Therefore, the emitting efficiency of the light emitting device 200a can be enhanced by the exertion of the applied magnetic field due to the achievement of impedance matching.

Figure 10:
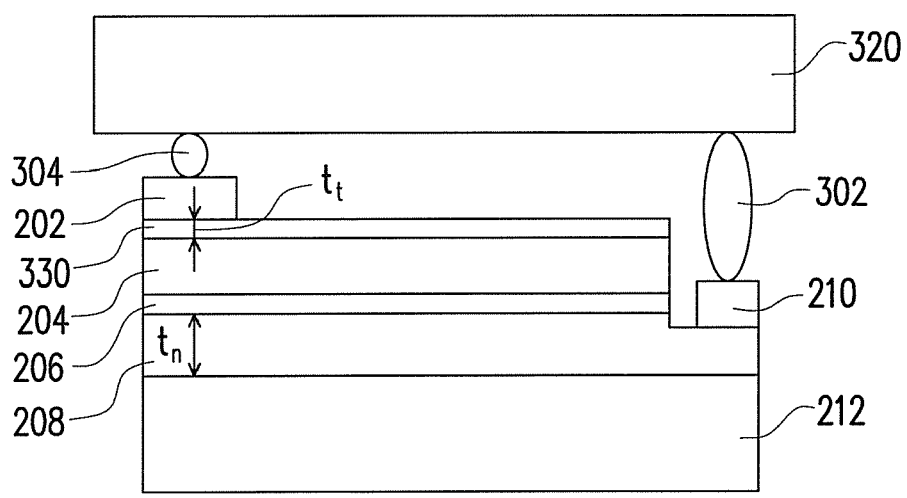

FIG. 10 is a schematic cross-sectional diagram illustrating a light emitting device according to an embodiment of the disclosure. The identical elements shown in FIGS. 9 and 10 are designated with the same reference numbers, and detailed descriptions of the same or like elements are omitted hereinafter.

Referring to FIG. 10, the structural components of the light emitting device 300a are roughly similar to that of the light emitting device 200a shown in FIG. 9, while the difference lies in the deployment of the magnetic layer 320. In an embodiment, a packaging structure, e.g. a flip chip package, can be employed to couple the magnetic layer 320 with the light-emitting structure. In other words, the first electrode 202 and the second electrode 210 of the light-emitting structure can be mounted onto a magnetic submount 320. The magnetic submount 320 can also produce the magnet field into the light emitting device 300a, thereby enhancing the emitting efficiency due to the achievement of impedance matching.

Figure 11:
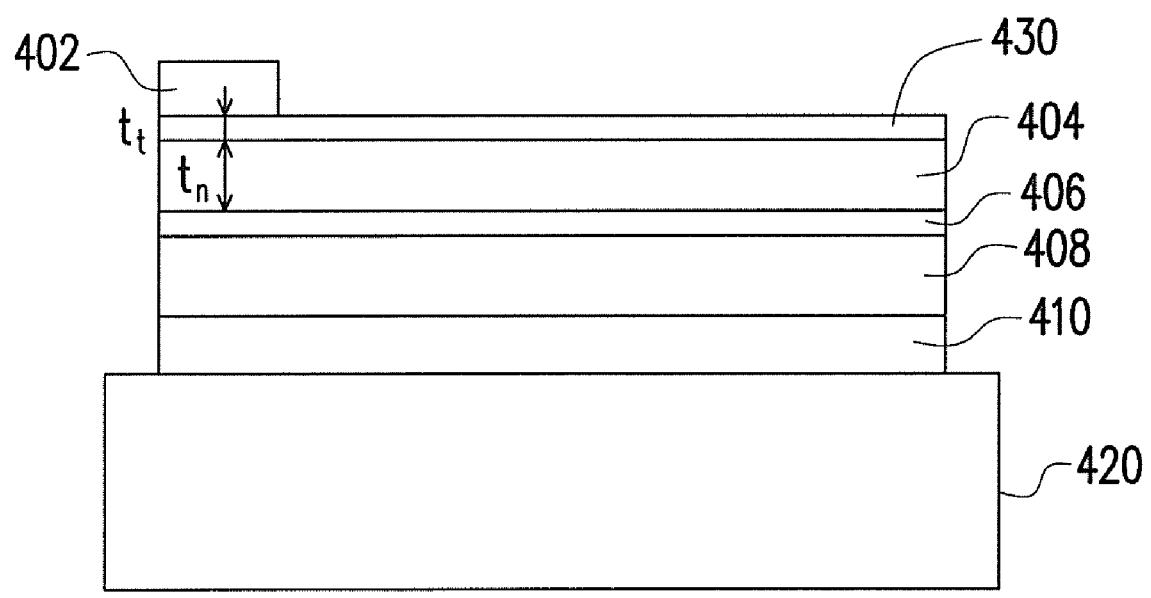

FIG. 11 is a schematic cross-sectional diagram illustrating a light emitting device according to an embodiment of the disclosure.

As for a thin film LED having a vertical type structure, as shown in FIG. 4, the light emitting device 400a includes a light-emitting structure and a magnetic submount 420. The structure of the light emitting device 400a is roughly similar to that of the light emitting device 400 shown in FIG. 4, while the difference lies in the deployment of a transparent conductive layer 430. The transparent conductive layer 430 is further disposed above the second doped layer 404, so as to enhance the effect of current crowding. The transparent conductive layer 430 has a thickness $t_t$, and the second doped layer 404, i.e. N-type layer, has a thickness $t_n$. The thickness $t_t$ and the thickness $t_n$ can be adjusted in accordance with different materials of the transparent conductive layer 430 and the second doped layer 404 respectively, so as to achieve impedance matching. Therefore, the emitting efficiency of the light emitting device 400a can be enhanced by the exertion of the applied magnetic field.

Furthermore, when the light emitting device is an organic light emitting device, the anode can be composed of transparent conductive layer. Taking the light emitting devices 600 and 700 illustrated in respective FIGS. 6 and 7 as an example, the anode layer 604 has a thickness $t_t$, and the electron transporting layer (ETL) 610 and the electron injection layer (EIL) 616, i.e. N-type layer, jointly have a thickness $t_n$. The thickness $t_t$ and the thickness $t_n$ can be adjusted in accordance with different materials of the anode layer 604 and the electron transporting layer (ETL) 610 and the electron injection layer (EIL) 616 respectively, so that the magnetoresistance of the transparent conductive layer is easily controlled to be substantially equal to that of N-type layer with the application of the magnetic field. Therefore, the emitting efficiency of the light emitting devices 600 or 700 can be enhanced by the exertion of the applied magnetic field due to the achievement of impedance matching.

In an embodiment, when the light emitting device 600 or 700 includes the hole transporting layer (HTL) 606, the electroluminescent layer 608 and the electron transporting layer (ETL) 610 stacked between the anode layer 604 and the cathode layer 612 without the deployment of the hole injection layer (HIL) 614 and the electron injection layer (EIL) 616, the thickness $t_n$ of the N-type layer may refer to the thickness of the electron transporting layer (ETL) 610 solely. The organic light emitting device can also be implemented by containing at least one of the foregoing layers between the anode layer 604 and the cathode layer 612, and is not construed as limiting the scope of the disclosure. Therefore, the thickness $t_t$ and $t_n$ may be modified on the basis of the respective deployments of the transparent conductive layer and the N-type layer.

Following examples are provided to prove that the light emitting device has better improvement in luminous efficiency with the exertion of the magnetic field by well controlling the thickness $t_t$ and $t_n$. These examples are provided merely to illustrate effects upon forward voltage and light output power made by the deployment of the magnetic material in the disclosure, but are not intended to limit the scope of the disclosure.

Example II

Figure 12A:
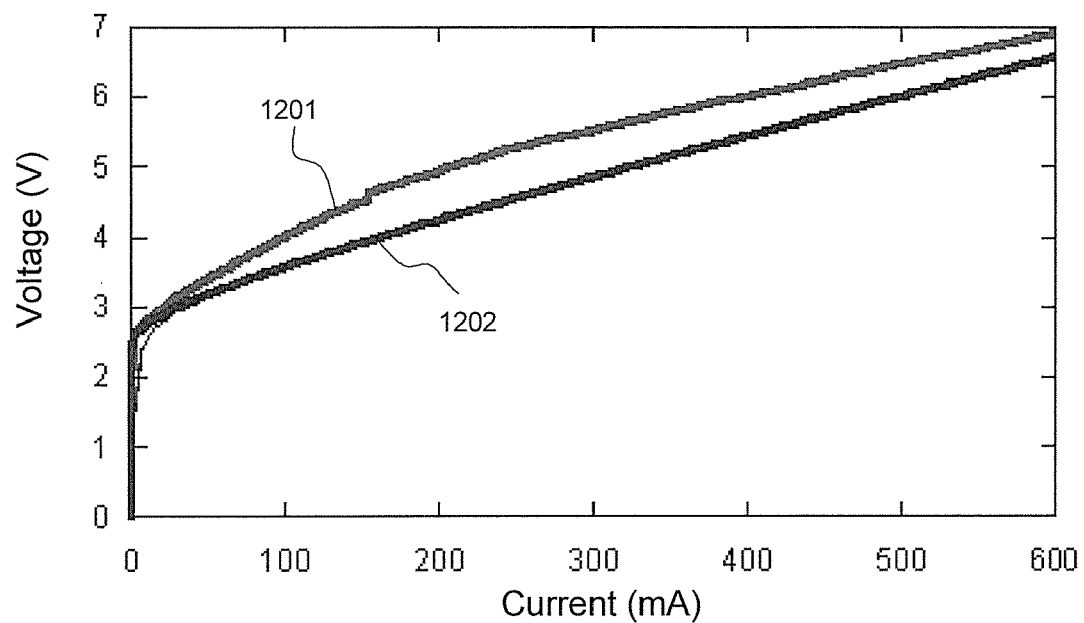
FIG. 12A schematically illustrates distribution curves of injected current versus forward voltage according to a light emitting device with and without the application of the magnetic field, respectively.
Figure 12B:
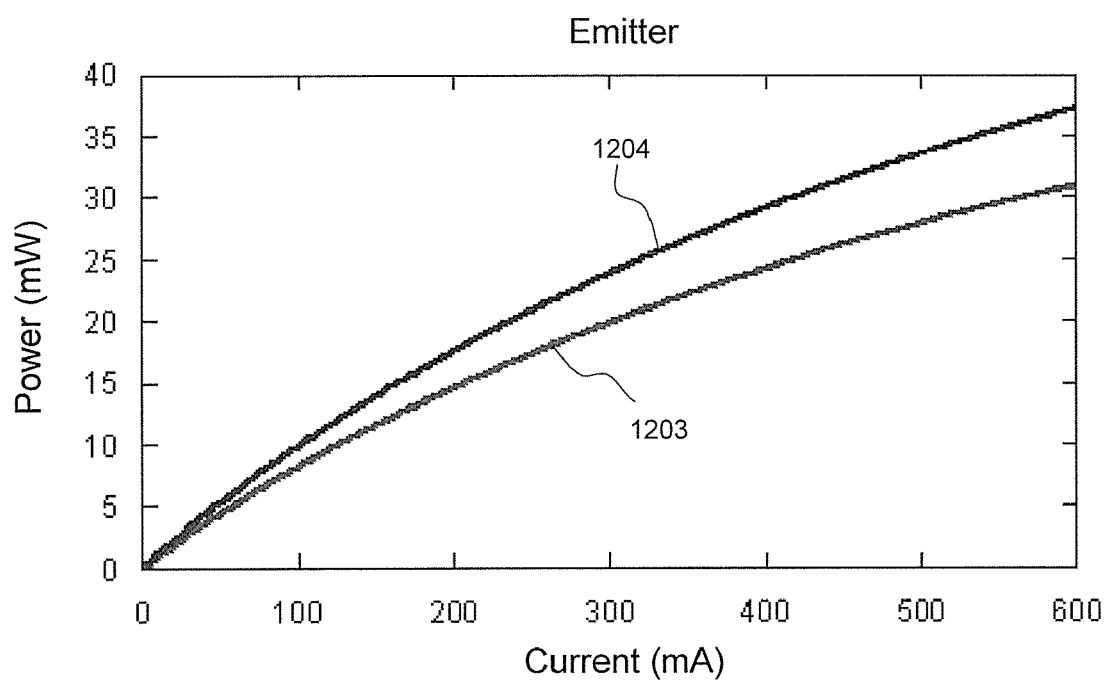
FIG. 12B schematically illustrates distribution curves of injected current versus emitting power according to a light emitting device with and without the application of the magnetic field, respectively.

FIG. 12A schematically illustrates distribution curves of injected current versus forward voltage according to a light emitting device with and without the application of the magnetic field, respectively. FIG. 12B schematically illustrates distribution curves of injected current versus emitting power according to a light emitting device with and without the application of the magnetic field, respectively.

A GaN LED is utilized as a sample, and the transparent conductive material is formed on the surface of the GaN chip. An alloy of nickel and gold, i.e. Ni/Au, serves as the transparent conductive material formed on the surface of the GaN LED. The thickness $t_t$ of Ni/Au layer is about 90 Å, while the thickness $t_n$ of GaN (N-type layer) is about 28000 Å. Afterwards, the forward voltage and the emitting power of the GaN LED are measured with and without the application of the magnetic field, and the test results are shown in FIG. 12A and FIG. 12B, respectively.

As shown in FIG. 12A, curve 1201 represents the measured forward voltage of the GaN LED without applying the magnetic field thereto, while curve 1202 represents the measured forward voltage of the GaN LED under the magnetic field of about 0.3 Tesla (T). It can be observed that the distribution of curve 1202 is lower than the distribution of curve 1201. Overall, the forward voltage of the GaN LED can drop more than 5% with the aid of the applied magnetic field.

As shown in FIG. 12B, curve 1203 represents the measured light output power of the GaN LED without applying the magnetic field thereto, while curve 1204 represents the measured power of the GaN LED under the magnetic field of about 0.3 Tesla (T). The distribution of curve 1204 is much higher than the distribution of curve 1203. More specifically, the light emitting efficiency of curve 1204 is enhanced by more than 20% as compared with curve 1203, thereby indicating that the light emitting efficiency of the GaN LED can be significantly improved by applying the magnetic field.

In view of the above, with the enhancement of the exciting binding energy of the semiconductor material in the light emitting device, the improvement in the IQE and the carrier combination can be achieved. Accordingly, the light emitting efficiency of the light emitting device is significantly enhanced.

In addition, the magnetoresistance of the transparent conductive layer and the N-type layer can be substantially equal to each other by easily adjusting the respective thickness thereof with the application of the magnetic field. Since the impedance matching of the transparent conductive layer and the N-type layer can be obtained with the exertion of the magnetic field, the largest uniform distribution area of the current is obtained in the light emitting device. Hence, the current homogeneity and the light emitting efficiency of the light emitting device can be enhanced effectively.

Even further, the magnetic field can be applied to the light emitting device in the manners as described above, so as to enhance the light emitting efficiency and increase the luminance of the light emitting device.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting device, comprising:
    a light-emitting structure, comprising:
        a P-type layer;
        a transparent conductive layer, having an electrical resistivity $\rho_t$, a thickness $t_t$ and a carrier mobility $\mu_t$; and
        an N-type layer, having an electrical resistivity $\rho_n$, a thickness $t_n$, and a carrier mobility $\mu_n$; and
    a magnetic material, coupled with the light-emitting structure to produce a magnetic field B in the light-emitting structure,
    wherein a magnetoresistance of the transparent conductive layer $$\frac{\rho_t}{t_t}(1 + \mu_t^2 B^2)$$

is substantially equal to a magnetoresistance of the N-type layer $$\frac{\rho_n}{t_{nl}}(1 + \mu_n^2 B^2).$$

2. The light emitting device according to claim 1, wherein $$\left| \frac{\frac{\rho_t}{t_t}(1 + \mu_t^2 B^2) - \frac{\rho_n}{t_{nl}}(1 + \mu_n^2 B^2)}{\frac{\rho_t}{t_t}(1 + \mu_t^2 B^2) + \frac{\rho_n}{t_{nl}}(1 + \mu_n^2 B^2)} \right| \leq 0.2.$$

3. The light emitting device according to claim 1, wherein an original resistance of the transparent conductive layer $$\frac{\rho_t}{t_t}$$

is greater man or equal to an original resistance of the N-type layer $$\frac{\rho_n}{t_{nl}}.$$

4. The light emitting device according to claim 1, wherein $$\frac{\left|\frac{\rho_t}{t_t} - \frac{\rho_n}{t_{nl}}\right|}{\left|\frac{\rho_t}{t_t} + \frac{\rho_n}{t_{nl}}\right|} \leq 0.5.$$

5. The light emitting device according to claim 1, wherein the transparent conductive layer comprises metal.

6. The light emitting device according to claim 5, wherein the transparent conductive layer comprises Ni/Au.

7. The light emitting device according to claim 5, wherein the thickness t, is within a range of 50 Å to 150 Å.

8. The light emitting device according to claim 1, wherein the transparent conductive layer comprises semiconductor.

9. The light emitting device according to claim 8, wherein the transparent conductive layer comprises indium tin oxide (ITO) and zinc oxide (ZnO).

10. The light emitting device according to claim 8, wherein the thickness t, is within a range of 1000 Å to 5000 Å.

11. The light emitting device according to claim 1, wherein the N-type layer comprises semiconductor.

12. The light emitting device according to claim 11, wherein the N-type layer comprises GaAs, a nitride-based material, an In-based material, an Al-based material, a Ga-based material, a Si-based material, or a Pb-based material.

13. The light emitting device according to claim 1, wherein the transparent conductive layer is disposed on a surface of the P-type layer.

14. The light emitting device according to claim 1, wherein the magnetic material is a magnetic film or a magnetic bulk.

15. The light emitting device according to claim 1, wherein the magnetic field B is greater than 0.01 gauss (G).

16. The light emitting device according to claim 1, wherein the light-emitting structure comprises an inorganic material.

17. The light emitting device according to claim 16, further comprises:
    an active layer, disposed between the N-type layer and the P-type layer;
    a first electrode, coupled to the P-type layer; and
    a second electrode, coupled to the N-type layer.

18. The light emitting device according to claim 1, wherein the light-emitting structure comprises an organic material.

19. The light emitting device according to claim 18, further comprises:
    an electroluminescent layer, disposed between the P-type layer and the N-type layer; and
    a cathode, disposed on the N-type layer.

20. The light emitting device according to claim 19, wherein the N-type layer comprises an electron transporting layer (ETL).

21. The light emitting device according to claim 20, wherein the N-type layer further comprises an electron injection layer (EIL), disposed between ETL and the cathode.

22. The light emitting device according to claim 19, wherein the P-type layer comprises a hole transporting layer (HTL), disposed between the transparent conductive layer and the N-type layer.

23. The light emitting device according to claim 22, wherein the P-type layer further comprises a hole injection layer (HIL), disposed between HTL and the transparent conductive layer.

* * * * *